United States Patent [19]

Anthony et al.

[11] Patent Number: 4,595,428

[45] Date of Patent: Jun. 17, 1986

[54] METHOD FOR PRODUCING HIGH-ASPECT RATIO HOLLOW DIFFUSED REGIONS IN A SEMICONDUCTOR BODY

[75] Inventors: Thomas R. Anthony, Schenectady; Douglas E. Houston, Liverpool; James A. Loughran, Scotia, all of N.Y.

[73] Assignee: General Electric Company, Schenectady, N.Y.

[21] Appl. No.: 567,708

[22] Filed: Jan. 3, 1984

[51] Int. Cl.⁴ .......................................... H01L 21/228
[52] U.S. Cl. ................................... 148/187; 148/186; 148/179
[58] Field of Search ............... 148/171, 179, 183, 186, 148/187; 219/121 LL; 357/20, 30, 32, 55, 88

[56] References Cited

U.S. PATENT DOCUMENTS

| | | | |
|---|---|---|---|
| 2,813,048 | 11/1957 | Pfann | 148/1.5 |
| 2,890,976 | 12/1954 | Lehovec | 148/171 |
| 3,372,070 | 3/1968 | Zuk | 148/186 |
| 3,901,736 | 8/1975 | Anthony | 148/171 |
| 4,377,423 | 3/1983 | Anthony | 148/171 |
| 4,527,183 | 7/1985 | Anthony | 357/32 |

OTHER PUBLICATIONS

Anthony, "Forming Electrical Interconnections Through Semiconductor Wafers", *J. Appl. Phys.* 52(8), 8/81.

Anthony, "Diodes Formed by Laser Drilling and Diffusion", *J. Appl. Phys.* 53(12), 12/82.

Anthony, "Semiconductor Wafers by Double-Sided Sputtering", *IEEE Tran. Comp., Hybrids & Manuf. Tech.* CHMT-5, #1, 3/82.

"Effects of Crystal Orientation, Temperature, and Molten Zone Thickness in Temperature-Gradient Zone-Melting" by J. H. Wernick [Journal of Metals, Transactions AIME (Oct. 1957) pp. 1169–1173].

*Primary Examiner*—Aaron Weisstuch
*Assistant Examiner*—John Callahan
*Attorney, Agent, or Firm*—James Magee, Jr.; James C. Davis, Jr.

[57] ABSTRACT

A semiconductor device and a method for its preparation are disclosed, wherein a body of semiconducting material has at least one bore extending completely therethrough, this bore having a substantially constant diameter of less than about 1.5 mils and an average length-to-diameter ratio of at least about 6:1, this bore being defined by a region of the semiconducting material in the recrystallized state having therein throughout the region a substantially constant uniform concentration level of atoms of at least one metal selected from the group consisting of aluminum, indium, gallium, antimony, gold, silver and tin in addition to the initial content of the semiconducting material.

4 Claims, 5 Drawing Figures

METHOD FOR PRODUCING HIGH-ASPECT RATIO HOLLOW DIFFUSED REGIONS IN A SEMICONDUCTOR BODY

The invention herein is related to the invention disclosed and claimed in pending U.S. patent application Ser. No. 544,935—Anthony, et al, filed Oct. 24, 1983. Ser. No. 544,935 is assigned to the same assignee as the instant application and is incorporated by reference.

FIELD OF THE INVENTION

This invention relates broadly to the semiconductor arts and more particulary to a method for making a diode by establishing semiconductor regions of generally uniform cross-section substantially concentric with small diameter, high-aspect ratio bores that extend completely through semiconductor bodies.

BACKGROUND OF THE INVENTION

For a number of electronic devices, high-aspect ratio semiconducting regions, e.g. diodes, extending through the thickness of a semiconductor body are desirable.

Direct diffusion of an impurity through the thickness of a semiconductor body from the top surface to the bottom surface through solid material requires diffusion times that are longer than desirable from a productivity standpoint. The semiconducting regions produced by direct diffusion through the solid semiconductor material generally spread further laterally into the interior of the body, away from a path straight through the body, than is desired. The junctions produced between the diffused regions and the body by direct diffusion are generally irregular, e.g. hour-glass shaped, when viewed in the cross-section of the body when the impurity has been diffused from both top and bottom surfaces. These undesirable characteristics of directly diffused through-thickness semiconducting regions become more pronounced as the thickness of the body is increased to provide added strength as the surface dimensions are increased to provide more area for active device fabrication.

Methods are availabe for enhancing the production of through-thickness regions in semiconductor bodies. One method, such as is described in U.S. Pat. No. 4,227,942, involves the use of a chemical etch to expose areas interior to and beneath the surface of the body. These etchants are generally slow acting, produce holes whose dimensions are sensitive to thickness variations unless special procedures are followed, and are sensitive to crystallographic orientations within the body, i.e., the etchants are anisotropic. Since the etchants are anisotropic, the holes produced are typically in the form of truncated tetrahedrons. Hour-glass-shaped openings through a semiconductor wafer having semiconducting regions of opposite type lining each opening are shown in "Isolated Power Feed-Thru Holes" by R. C. Joy and W. J. Nestork (IBM Technical Disclosure Bulletin, Vol. 16, No. 11, April 1974).

Other methods, such as the one described in U.S. Pat. No. 4,137,100, involve the formation of excavations, i.e., pits or trenches, in the substrate to allow the diffusion processes to commence from levels below the surface of the body. If a laser beam is used to form the excavations, either before or after the impurity is applied, the diffusion time and lateral spreading are decreased, but at the expense of damage, in the form of dislocations or diffusion pipes, to the semiconductor body.

Two additional methods of producing through-thickness diodes are thermal gradient zone melting (TGZM) and electromigration. U.S. Pat. Nos. 3,899,361—Cline and Anthony and 3,901,736—Anthony and Cline are representative of inventions employing TGZM in the production of diodes. In these methods metal-rich droplets are migrated from a location on one face of a solid body of semiconductor material (e.g. a silicon wafer) into or through that body leaving a solid plug of recrystallized semiconducting material in its wake. The movement of a metal-rich droplet through a body of semiconducting material to produce a similar recrystallized plug by the application of an electrical potential gradient (i.e. electromigration) is described in U.S. Pat. No. 4,377,423—Anthony. These modes of processing are referred to herein as "bulk migration".

U.S. '423, in addition to describing bulk migration, also discloses the use of electromigration for effecting the migration of a liquid metal droplet along a thin film of semiconducting material supported on, but not part of, a non-conducting substrate. It is pointed out therein that thin film electromigration velocities are 100 to 1000 times faster than bulk electromigration rates.

All of U.S. '361, '736 and '423 are incorporated by reference.

A limitation of bulk migration techniques is that as the size of the recrystallized semiconductor regions decreases below about 10 mils, the practice of TGZM and electromigration become increasingly difficult and complex.

As used herein, unless otherwise specified, the term "cylindrical" is used to described the surface traced by a straight line moving parallel to a fixed straight line and intersecting a circle. When dealing with holes with length-to-diameter ratios greater than 20, the walls of the hole tend to have some taper with the entrance diameter of the hole being slightly larger than the exit diameter of the hole. As used herein and in the appended claims, the term "hole" is considered equivalent to the term "bore".

BRIEF DESCRIPTION OF THE INVENTION

A device and a method for its preparation are disclosed, wherein a semiconductor body has at least one bore extending completely therethrough, this bore being defined by a region in the general shape of a hollow cylinder. This region is enriched with metal atoms (i.e. foreign metal atoms) different from the material(s) comprising the bulk composition (e.g. silicon) of the semiconducting body, these foreign metal atoms being substantially uniformly distributed in said region. Typically the foreign metal atoms will impart a conductivity type opposite to, and a resistivity lower than, the material of the body contiguous to the bore-defining region, this bore having a substantially constant diameter of less than about 1.5 mils and an average length-to-diameter ration of at least about 6:1.

Briefly described, the method of the invention comprises the steps of forming, by the use of laser drilling at low to medium power multipulse operation, one or more bores (dimensioned as described above) extending completely through the thickness of a semiconductor body and then migrating a droplet of metal-rich liquid along the inside surface of the bore by thermomigration or electromigration. The body may be of any semiconductor material of any crystallographic orientation.

Generally, in the construction of practical devices, but not necessarily, additional processing steps will be carried out. Such additional processsing steps may provide, for example, active devices in contact with the semiconductor regions, means for addressing these regions, or possibly combinations of the two.

Whereas the foreign metal atom content of the concentric regions defining high-aspect bores prepared by the method disclosed in Ser. No. 544,935 (i.e. solid state diffusion) is non-uniformly distributed in such regions, the foreign metal atom content in the bore-defining regions of this invention are substantially uniformly distributed. This arrangement results in a sharp definition of the region such that behavior of P-N junctions prepared by this invention is significantly different from P-N junctions prepared by the use of solid state diffusion.

Most important is the very great speed with which these regions are established by the method of this invention as compared to the use of solid state diffusion, i.e. $10^5$ to $10^7$ times faster. Solid state diffusion processing is conducted in the 1100°–1300° C. range and would result in destruction of pre-existing devices incorporated in the semiconducting body. In the process of this invention in which operating temperature can range from about 630° C. to about 1420° C., even when temperatures greater than 1000° C. are employed it is safe to introduce foreign metal atom content to regions defining bores extending through a semiconducting body, e.g. a silicon wafer, that already has devices incorporated therein. Because of the very high speed of the metal-rich droplet migration along the inner surface of the bore, the time at temperature for the body being processed is short enough not to cause movement of the P-N junction(s) already present, which movement would have the destructive effect.

Not only is this method an improvement over solid state diffusion techniques as described in Ser. No. 544,935, it is also a significant improvement over bulk migration. Movement of the droplet of metal-rich liquid along a previously prepared laser drilled hole insures much greater alignment accuracy; the process carried out at a rate of about $10^{-6}$ cm/sec is 100 to 2000 times faster than bulk migration, and, whereas the smallest feasible droplet usable in bulk migration is about 5–8 mils, much smaller droplets (as little as ¼ mil) can be used in the method of this invention.

A device, made by the process will comprise a body of semiconductor material having at least one small diameter, high-aspect ratio bore as described hereinabove. A region containing foreign metal atoms surrounds the bore and is located substantially concentric with the bore being essentially in the form of a hollow cylinder extending through the body.

Generally, in practical devices, there will be a plurality of such bores, and associated substantially concentric semiconductor regions, arranged in a predetermined array. This invention is primarily concerned with the preparation of diodes, more particularly, with the preparation of diodes in silicon and is the manner in which the invention is described.

Foreign atoms from the group consisting of aluminum, indium, gallium and antimony (obtained from aluminum, aluminum alloys, indium, indium alloys, gallium, gallium alloys, antimony and antimony alloys) are useful for the preparation of diodes in appropriate semiconducting material. It is also within the scope of this invention to introduce foreign metal atoms for producing regions presenting impurities such as gold or silver to function as killers of the lifetime of minority carriers or for producing a neutral region by introducing tin atoms using tin or tin alloys. In addition to silicon, other semiconductor materials such as germanium, gallium phosphide, gallium arsenide, indium antimonide, cadmium telluride, and zinc sulfide may be used.

BRIEF DESCRIPTION OF THE DRAWINGS

The features of this invention believed to be novel and unobvious over the prior art are set forth with particularity in the appended claims. The invention itself, however, as to the organization, method of operation and objects and advantages thereof, may best be understood by reference to the following description taken in conjunction with the accompanying drawing wherein:

MANNER AND PROCESS OF MAKING AND USING THE INVENTION

Figure 1:
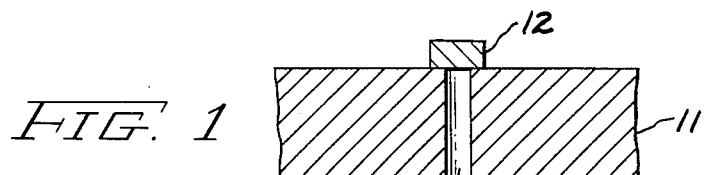
FIG. 1 is a view in cross-section of a portion of a body of semiconductor material having a high-aspect ratio bore extending therethrough and having a discrete metal mass located on the surface of the body adjacent the bore.
Figure 2:
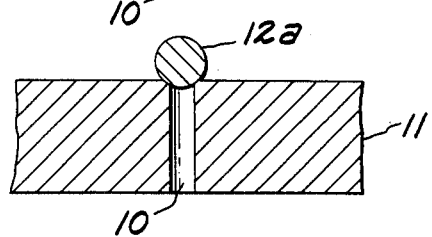
FIG. 2 is the same as FIG. 1 except that the metal mass has been melted and has formed a droplet ready for the migration step.
Figure 3:
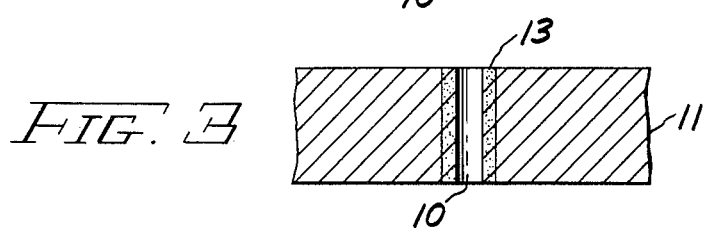
FIG. 3 shows the body of FIGS. 1 and 2 after the migration step resulting in formation of a region in the shape of a hollow cylinder with metal atoms from the droplet substantially uniformly distributed therein.

Referring now to FIGS. 1–3 of the drawings at least one hole, or bore, 10 is introduced in silicon wafer 11, a portion of which is shown, by the use of multipulse laser drilling at low to medium power output. Bore 10 is dimensioned such that the bore diameter is in the range of from about 1.5 to about 0.25 mil and the average length-to-diameter ratio is at least about 6:1.

A laser system successfully utilized to introduce such bores in silicon wafers is an Electro Scientific Industries Laser Trimming System Model 25 (ESI-25) modified by substituting a 10-watt output (in the continuous wave mode) optoacoustic Q-switched Nd:YAG head manufactured by U.S. Laser Corp. for the original laser head. The Nd:YAG laser has a short wave length (1.06 microns) and silicon readily absorbs Nd:YAG light.

The laser was operated in a repetitively Q-switched mode with a focused beam size of about 20 microns, a depth of focus of about 250 microns, an individual pulse duration of about 200 nanoseconds and a repetition rate of about 3 KHz. At a power level of about 2 watts, measured independently in a continuous pulsed mode, ten pulse trains of 5 msec duration separated by a 10 msec delay were used to drill approximately 5 holes per second. By carefully controlling the number of pulses from a laser operating with the above-described parameters, bores extending through the thickness of silicon water 11 can be reproducibly produced.

Generally selection of a suitable laser can be made for the practice of this invention employing the following criteria:
(a) Nd:YAG;
(b) Q-switched;
(c) wave length; 1.06 microns (or shorter by frequency doubling);
(d) pulse length: 200 nanoseconds or shorter; and
(e) spacing between pulses: 1–3 kHz.

Some surface blemishes, caused by the fallout of debris from the bores during drilling, were observed when drilling was done on bare silicon wafers. Such blemishes were avoided by precoating both sides of the water with black acrylic spray paint and removing that coating in toluene after drilling. The debris from each drilled bore were washed away with the protective paint coating. Other coatings such as photoresist, paraffin, or silicone grease should work equally as well as acrylic spray, but are less easily removed than acrylic spray paint.

Once through-bore 10 has been introduced, an initial metal mass from ½ to 25 microns thick is disposited, e.g. by electron beam evaporation in a vacuum, over the surface of silicon wafer 11 and covering the openings to any bores. Thereafter, metal can be selectively removed from the wafer surface as by simple polishing or selective etching to position discrete metal-rich mass 12 over each bore 10. An alternate method is to place metal shot having a diameter slightly larger than the bore diameter on the wafer surface and gently rocking and vibrating the wafer to cause a shot to fall in each hole.

It is not critical that the initial metal to yield the desired mass of metal (e.g. mass 12) for migration along the inner surface of hole 10 bridge the hold. Thus, prior to introducing bores 10 through body 11, one major surface can be provided with a layer of metal (not shown), the bores 10 can be laser drilled through the metal coating and the semiconducting body and then the initial coating can be selectively removed to leave a mass differing from mass 12 in that it will have a hole therethrough in line with bore 10.

Another method would employ a photoresist layer. Thus, a layer (not shown) of conventional photoresist material would be deposited on a major surface of wafer 11, the photoresist would then be masked, exposed and developed to generate openings into which the discrete masses 12 of metal would be deposited. Thereafter, the photoresist would be removed.

Having located a mass of metal adjacent the opening to bore 10, apparatus such as is disclosed in U.S. Pat. No. 4,075,038—Anthony and Cline (incorporated by reference) can be used to carry out thermomigration as described hereinafter. First, wafer (or body) 11 is rapidly heated to a temperature above which the metal of mass 12 will form an alloy melt with the metal of body 11 (e.g. silicon) around the entrance to the hole. The resulting droplet 12a should have a diameter greater by at least about 20% than the average diameter of bore 10. A thermal gradient (e.g. about 50° C. per cm) is established and maintained across body 11 to effectuate migration of metal-rich molten droplet 12a along the length and peripheral extent of the inner surface of bore 10. After completion of the migration, the metal zone that reaches the opposite face of body 11 is removed by etching an aqua regia or KOH.

If desired by using apparatus such as is described in U.S. '423, droplet 12a can be caused to migrate in a similar manner by the utilization of an electrical potential gradient (i.e. electromigration).

Using either method, as migration of the alloy droplet 12a as a molten zone proceeds through wafer 11 along the inner surface of bore 10, recrystallized single crystal region 13 in the shape of a hollow cylinder is produced in its wake. Region 13 will contain in addition to its original composition, material (i.e. foreign metal atoms) present in the liquid metal of droplet 12a in solid solution up to the solubility limit thereof at the prevailing migration temperature in the semiconducting material of body 11. By utilizing an appropriate metal from the listing provided hereinabove, the resulting recrystallized region 13 will be single crystal semiconducting material having a resistivity and a conductivity type different from that of body 11 to produce a P-N junction as the interface between region 13 and body 11.

Migration of droplet 12a through body 11 in the above-described manner occurs 100 to 2000 times faster than does migration in the case of bulk migration. Also, as compared to solid state diffusion, production of a region defining a bore, such as bore 10, is $10^5$ to $10^7$ times faster.

The specific geometry afforded body 10 will be determined by its end use, but thin (i.e., on the order of about 6 to about 100 mils thick) wafers and square or rectangular chips of semiconducting material are common.

Figure 4:
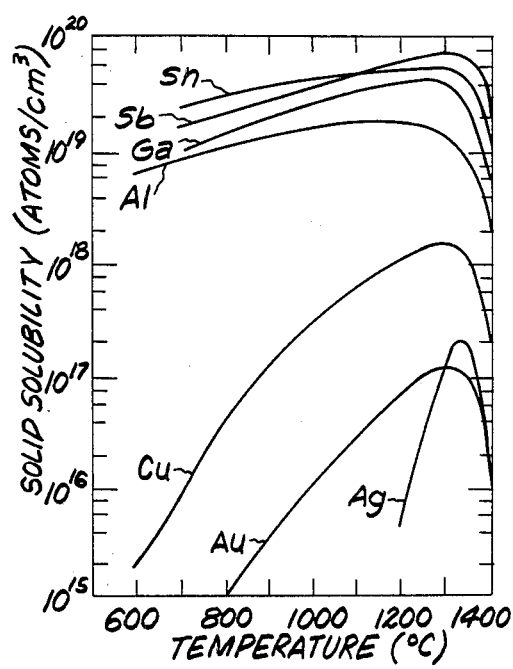
FIG. 4 is a graph displaying the solid solubility of various foreign metal atoms in silicon as a function of temperature and FIG. 5 is a semi-logarithmic graph of migration velocity divided by thermal gradient as a function of inverse temperature for molten aluminum migrating in bulk silicon and along the surface of a high-aspect ratio bore in silicon.

The curves in FIG. 4 provide data for setting the operating temperature for conduct of the migration of droplet 12a so as to produce a region 13 having some predetermined foreign atom content (atoms/cm$^3$) in silicon.

Figure 5:
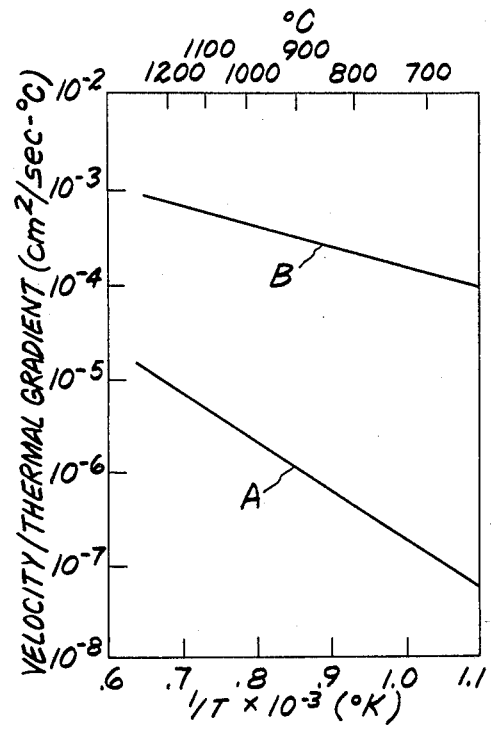

FIG. 5 is graphically illustrative of the far greater speed with which a molten droplet of aluminum (alloyed with silicon) will migrate along the inner surface of a high-aspect ratio bore in a silicon wafer as compared to the speed with which that same droplet will migrate through bulk silicon.

EXAMPLE

A silicon wafer 2" in diameter and 0.013" thick with a <111> orientation and an N-type (Sb) conductivity of 10 ohm-cm was obtained from Monsanto Corp of St. Peters, Missouri. The wafer was polished on one face and ground to a 600 grit (20 micron) finish on the other.

The wafer was then placed in a metal evaporation chamber and a layer of aluminum 15 microns thick was deposited on the ground surface of the silicon wafer.

Next, an acid resistant second layer was deposited over the metal layer employing techniques well known in conventional photolithographical technology. This second layer, for example, was Kodak Metal Etch Resist. The resist was dried by baking at a temperature of 80° C. for one hour after it was deposited on the wafer. A suitable mask outlining a planar circular disk with a diameter of 0.002" was placed over the layer of photoresist and exposed to ultraviolet light. After exposure, the resist was washed in xylene to remove all of the resist except that which was covered by the disk mask.

The metal layer was selectively etched with a buffered hydrofluoric acid/nitric acid solution. The etching was continued until the exposed portion of the metal layer was completely removed. The processed wafer was then rinsed in deionized water and dried.

The remaining portion of the photoresist mask, i.e. the circular disk, was removed by immersing the wafer in a mixture made up of one part by volume of concentrated sulphuric acid and one part by volume by hydrogen peroxide.

The wafer was then rinsed in distilled water and blown dired with a gas (e.g. argon or nitrogen).

A hole was then drilled through the silicon water at the center of the metal disk deposit with the modified ESI-25 laser. The depth of focus and diameter of the laser beam were 250 and 25 microns respectively.

Operation of the laser was in the repetitively Q-switched mode with an individual pulse duration of 200 nanoseconds. The laser was programmed to emit a continuous train of individual pulses at a pulse repetition rate of 3 Khz until the drill hole was through the wafer. The 3 Khz pulse repetition rate was selected because it gave the highest output power in the Q-switched mode. Approximately, 50 pulses were required to drill through the wafer. The resulting drill hole had an entrance diameter of 30 microns and an exit diameter of 20 microns.

The silicon wafer with the hole through the center of the deposited metal disk and through the wafer itself was placed in a thermomigration apparatus and the temperature raised to 1100° C. at which temperature the aluminum formed an alloy melt with the silicon around the entrance to the hole. A thermal gradient of 50° C./cm was applied between opposing faces of the wafer such that the polished face of the wafer with the alloy melt was at a lower temperature than the opposite ground face of the wafer. The alloy melt was allowed to migrate down the hole for a sufficient amount of time (about one minute) to reach the opposite (i.e. the ground) surface. On completion of migration, the metal zone, which had migrated through the wafer, was removed by etching in aqua regia.

The passage of the molten alloy zone of aluminum through the hole, resulted in the formation of a cylindrical shell (about 15 $\mu$m thick) of recrystallized silicon concentric with the hole. This region had a constant uniform concentration level of aluminum throughout the recrystallized region of $1.4 \times 10^{19}$ atoms/cm$^3$. This concentration level contrasts with the nonconstant error function distribution of aluminum impurity that results from solid state diffusion from a gaseous source in the hole.

The recrystallized region had a P-type conductivity while the original silicon matrix retained its N-type conductivity. Consequently, a cylindrical P-N junction concentric with the hole was formed at the surface of the contact between the recrystallized zone and the original silicon matrix.

Outside of the recrystallized region, the silicon retained its initial impurity level of $5 \times 10^{14}$ atoms/cm$^3$. Consequently, the junction between the recrystallized material and the original silicon matrix was very sharp. The width of this junction is less than a micron. This width again contrasts with the diffused case, where the error function dropoff of impurity concentration may extend over many microns.

In carrying out the method of this invention not only was it found that migration through a hole in a wafer is much faster than through the wafer bulk, it was also found that smaller alloy zones could be moved through a wafer via a predrilled hole than could be moved through a wafer without a hole. This ability to move much smaller (those less than 3 mils in diameter) zones via predrilled holes is related to the fact that no surface tension barrier to migration exists in the case of predrilled holes, since the surface already extends through the wafer. Without holes, a surface tension barrier exist at the entrance surface of the wafer such as will hold smaller alloy zones on the surface. The effectiveness of this barrier is related to the alloy zone size. Small zones with a much higher surface-to-volume ratio have a proportionately higher barrier to overcome than large zone with a smaller surface-to-volume ratio. Alloy zones with diameters less than 3 mils will not migrate without a predrilled hole extending all of the way through the wafer even using the maximum temperature gradient of 60° C./cm that is obtainable in a thermomigration apparatus utilizing radiation heat transfer.

When the migration according to this invention is carried out using gold or silver as the foreign atoms introduced into region 13, devices located in the wafer adjacent region 13 will exhibit faster on-off response.

What is claimed is:

1. In the method of preparing a semiconductor device wherein a semiconductor body is provided with a bore by multipulse laser drilling, said bore having a diameter of less than about 1.5 mils and extending completely through said body with the average length-to-diameter ratio thereof being at least about 6:1, the improvement wherein a molten metal-rich droplet is migrated along the inside surface of the bore throughout the length of the bore, said droplet containing atoms of metal selected from the group consisting of aluminum, indium, gallium, antimony, gold, silver, and tin.

2. The improvement of claim 1 wherein the migration is accomplished by means of a thermal gradient.

3. The improvement of claim 1 wherein the migration is accomplished by means of an electrical potential gradient.

4. The improvement of claim 1 wherein the material of the semiconductor body is silicon and the molten droplet contains aluminum atoms.

* * * * *